(12) United States Patent
Dean et al.

(10) Patent No.: US 6,974,776 B2
(45) Date of Patent: Dec. 13, 2005

(54) ACTIVATION PLATE FOR ELECTROLESS AND IMMERSION PLATING OF INTEGRATED CIRCUITS

(75) Inventors: Timothy B. Dean, Elk Grove, IL (US); William H. Lytle, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/611,546

(22) Filed: Jul. 1, 2003

(65) Prior Publication Data

US 2005/0003677 A1     Jan. 6, 2005

(51) Int. Cl.[7] .......................... H01L 21/44; C25D 11/18
(52) U.S. Cl. .................... 438/678; 438/612; 438/613; 438/614; 438/782; 205/203; 205/205; 205/212; 205/213; 205/201
(58) Field of Search .................... 438/612–614, 438/678, 745, 754, 782; 205/201, 203, 205, 205/212, 213, 219, 221

(56) References Cited

U.S. PATENT DOCUMENTS

| 6,028,011 A | * | 2/2000 | Takase et al. ............... 438/745 |
| 6,362,089 B1 | | 3/2002 | Molla et al. |
| 2002/0096765 A1 | * | 7/2002 | Ling et al. .................. 257/738 |

* cited by examiner

Primary Examiner—Donghee Kang
(74) Attorney, Agent, or Firm—Cardinal Law Group

(57) ABSTRACT

The invention provides a method of plating an integrated circuit. An activation plate is positioned adjacent to at least one integrated circuit. The integrated circuit includes a plurality of bond pads comprising a bond-pad metal, and the activation plate also comprises the bond-pad metal. A layer of electroless nickel is plated on the bond pads and the activation plate, and a layer of gold is plated over the layer of electroless nickel on the bond pads and the activation plate. An integrated circuit with bond pads plated using the activation plate, and a system for plating an integrated circuit is also disclosed.

16 Claims, 5 Drawing Sheets

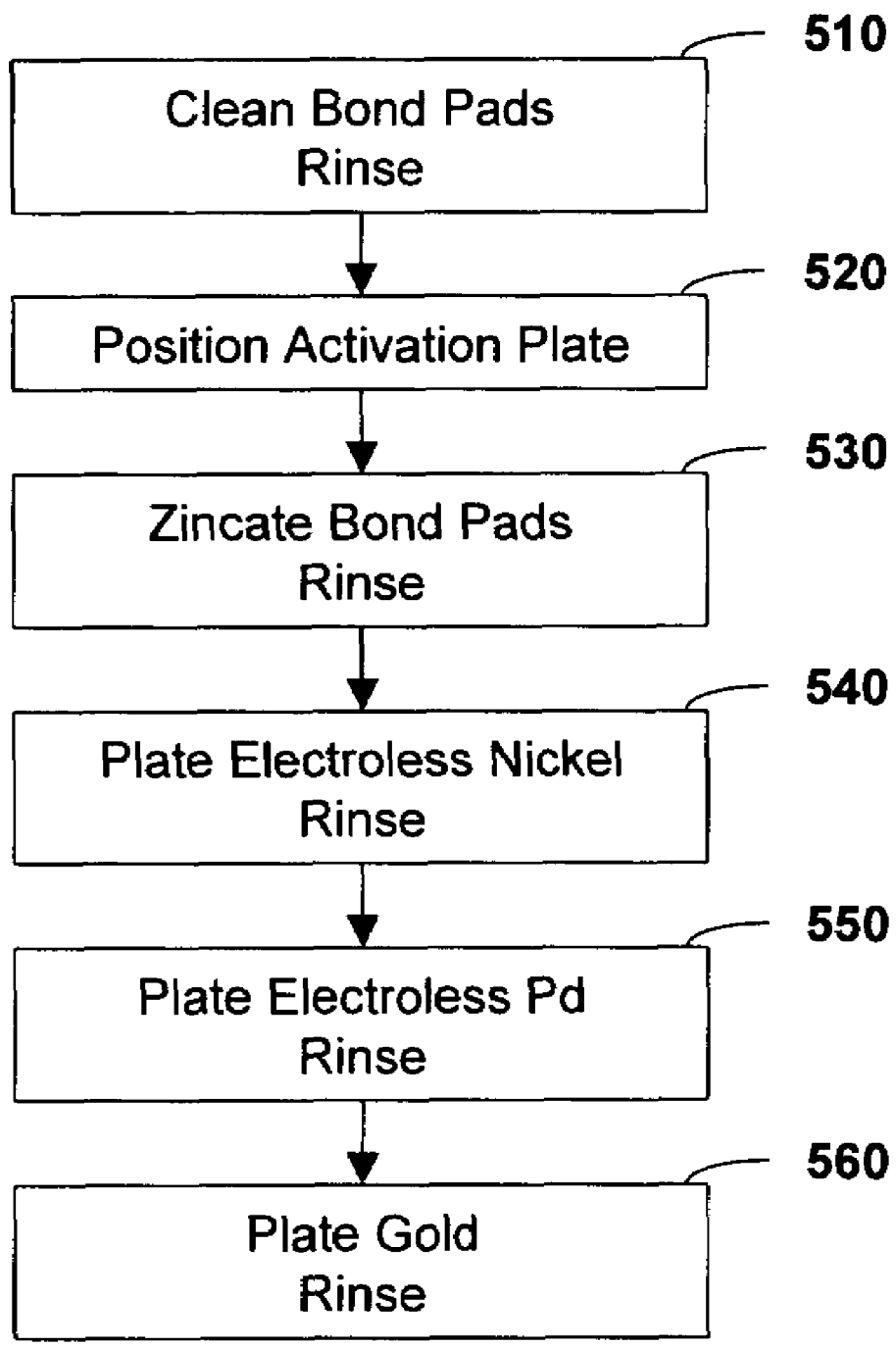

ACTIVATION PLATE FOR ELECTROLESS AND IMMERSION PLATING OF INTEGRATED CIRCUITS

FIELD OF THE INVENTION

The invention relates generally to semiconductor processing. More particularly, the invention relates to a method for plating metal bond pads on an integrated circuit using electroless and immersion plating.

BACKGROUND OF THE INVENTION

In the electronics industry, electroless plating and immersion plating are widely used processes for applying metal coatings to substrates. The processes are used extensively, for example, in printed circuit board and integrated package interposer fabrication, and in plating solderable or wirebondable finishes such as nickel-gold to copper surface pads. Electroless and immersion plating have been used to improve bond-pad properties for packaging where the integrated circuit interconnect metal is unacceptable.

Aluminum, for example, is not solderable, although an electroless nickel and immersion gold under-bump metallurgy (UBM) on aluminum bond pads provides solderability for flip-chip assemblies. Aluminum wirebonds well, yet aluminum bond pads on integrated circuits are susceptible to corrosion under standard environmental test conditions. This corrosion can cause performance degradation and product failure when the joint between the gold wire and aluminum pad degrades and fails.

A typical electroless nickel-gold (Ni—Au) bumping process for a flip-chip assembly with conventional aluminum bond pads requires removal of an insulating aluminum oxide layer from the bond-pad surface and good electrical connection to the underlying metal. In the Ni—Au process, oxide removal and surface activation are commonly done through zinc-displacement plating, using a zincate solution. The bump is then formed by selective electroless plating of nickel in a wet chemical, maskless process.

A method for forming a plated nickel layer and a plated gold layer on aluminum electrodes or solder bumps on a semiconductor device is disclosed by Takase et al. in "Method of Forming Electric Pad of Semiconductor Device and Method of Forming Solder Bump", U.S. Pat. No. 6,028,011 issued Feb. 22, 2000. The gold is applied over a nickel-phosphorous or palladium layer with an electroless gold-plating method in a substitution reaction. Takase does not teach plating a continuous palladium layer, but rather teaches seeding the reaction with palladium. The method avoids corrosion of the passivation film and the aluminum electrodes. Some manufacturers are trying to implement electroless nickel and immersion gold-plated aluminum pads on integrated circuits to provide superior corrosion resistance without encapsulation. The applications may include under-bump metal for flip-chip assembly and wirebondable finishes for copper pads. These methods for gold and nickel-phosphorous, however, run the risk, like other processes using multiple layers, of creating a mushrooming effect over passivation layers and consequential shorting between pads in fine-pitch arrays. Difficulties in such a process still include creating a uniform bonding surface with no nodules or foreign matter.

In recent years, copper has begun replacing aluminum in some silicon integrated circuits because of its lower resistance, which is good for high-frequency and radio-frequency (RF) circuits. Copper, however, is susceptible to corrosion, and is not easily soldered or wire-bonded. Electroless coatings for copper bond pads are being developed to help solve these problems. One method for processing a wafer having copper bond pads is disclosed by Molla et al. in "Method for Processing a Semiconductor Substrate having a Copper Surface Disposed Thereon and Structure Formed", U.S. Pat. No. 6,362,089 issued Mar. 26, 2002. The method coats the copper bond pads with solderable or wirebondable metals and allows for the wafer to be processed at temperatures less than or about 90 degrees centigrade. Void-free metal coatings are achieved using a dual activation process: the copper bond pads are activated by placing them in a palladium bath and then in a nickel-boron bath. After the dual activation process, the copper bond pads are coated with a layer of nickel-phosphorous or palladium. The elimination of copper voids enables the use of thin copper interconnects for dense integrated circuits, and increases bond shear strength and bond pull strength between the copper and nickel interface. The Molla invention uses an electroless nickel bath having a low concentration of lead.

Another proposed solution to protecting metal bond pads of conventionally packaged, non-hermetic chip-on-board assemblies is to encapsulate the bonded die with a silicone compound, which helps isolate the pads from standard environmental conditions such as high humidity. Unfortunately, dispensing and curing the silicone is a time-consuming process. The silicone, having a higher dielectric constant and loss tangent than air, may cause a degradation of high-frequency and RF performance. In addition, it is difficult to remove the silicone compound completely, precluding rework and repair.

A partial solution for providing corrosion-resistive bond pads in RF circuits and assemblies is to forego silicone encapsulation on die that are manufactured with gold bond pads, while selectively encapsulating any die in the assembly with aluminum pads. It is known in the art that a gold-to-gold junction is robust with respect to enduring environmental stress such as humidity testing at 85 degrees centigrade and 85 percent relative humidity. This partial solution, however, is limited because many die in the RF section and most of the die in the digital section of an assembly have aluminum bond pads, and therefore must still be encapsulated with the silicone compound for corrosion resistance.

There continues to be a need for a method of making metallic bond pads that are corrosion-resistant and wirebondable, and do not require encapsulation material such as silicone. The elimination of encapsulation would result in circuits and assemblies that do not require a complex cleaning process, have repairable and reworkable bond pads, have improved reliability of electrical connections to the integrated circuits, and do not have degraded RF performance.

Plated metals on top of aluminum or copper bond pads such as electroless nickel and gold have been shown to have desirable bonding properties and environmental resistance, even without silicone encapsulation. However, high-quality, repeatable electroless plating of integrated circuits is prevented by a number of problems. These problems cause some pads on an integrated circuit or semiconductor wafer to plate differently than others. Plated metals need to be uniformly applied with consistent morphology on all the bond pads of each integrated circuit. This uniformity and consistency is difficult to obtain when bond pads are of different sizes, different locations, and different metallurgies, and have different connectivities to the underlying semiconductor substrate, which result in small yet impactive electric potentials that vary from pad to pad.

Other issues may cause plating problems, such as varying pad metal composition, bond pad porosity, grain boundaries, variations in the surface finish of the pad metal, and thin pad metal. Other potential issues include inadequate passivation coverage, nodule formation, poor plating on pads grounded to the silicon substrate, galvanic cell effects that interrupt the plating process, photovoltaic effects that produce voltages at p-n junctions affecting the plating on associated bond pads, loss of plated material, inadequate coverage, local inhibition of the plating process, and overly aggressive cleaning cycles.

It would be beneficial, therefore, to provide an improved method for uniformly and reliably plating an integrated circuit with corrosion-resistant and wire-bondable metals at the wafer or die level, with the above-mentioned improvements, overcoming the deficiencies and obstacles described above.

SUMMARY OF THE INVENTION

One aspect of the invention provides a method of plating an integrated circuit. An activation plate is positioned adjacent to at least one integrated circuit, the integrated circuit including a plurality of bond pads comprising a bond-pad metal. The activation plate also comprises the bond-pad metal. A layer of electroless nickel is plated on the bond pads and the activation plate. A layer of gold is plated over the layer of electroless nickel on the bond pads and the activation plate.

Another aspect of the invention provides a system for plating an integrated circuit. The system includes means for positioning an activation plate adjacent to at least one integrated circuit, the integrated circuit including a plurality of bond pads comprising a bond-pad metal. The activation plate also comprises the bond-pad metal. The system includes means for plating a layer of electroless nickel on the bond pads and the activation plate, and means for plating a layer of gold over the layer of electroless nickel on the bond pads and the activation plate.

Another aspect of the invention provides an integrated circuit with a plurality of bond pads comprising a bond-pad metal, a layer of electroless nickel plated on the bond pads, and a layer of gold plated over the layer of electroless nickel. An activation plate comprising the bond-pad metal is positioned adjacent to the integrated circuit when the layer of electroless nickel is plated on the bond pads and when the layer of gold is plated on the nickel-plated bond pads.

The present invention is illustrated by the accompanying drawings of various embodiments and the detailed description given below. The drawings should not be taken to limit the invention to the specific embodiments, but are for explanation and understanding. The detailed description and drawings are merely illustrative of the invention rather than limiting, the scope of the invention being defined by the appended claims and equivalents thereof. The foregoing aspects and other attendant advantages of the present invention will become more readily appreciated by the detailed description taken in conjunction with the accompanying drawings.

BRIEF DESCRIPTION OF THE DRAWINGS

Various embodiment of the present invention are illustrated by the accompanying figures, wherein:

FIG. 5 is a flow diagram of a method for plating an integrated circuit, in accordance with one embodiment of the current invention.

DETAILED DESCRIPTION OF THE PRESENTLY PREFERRED EMBODIMENTS

Figure 1:
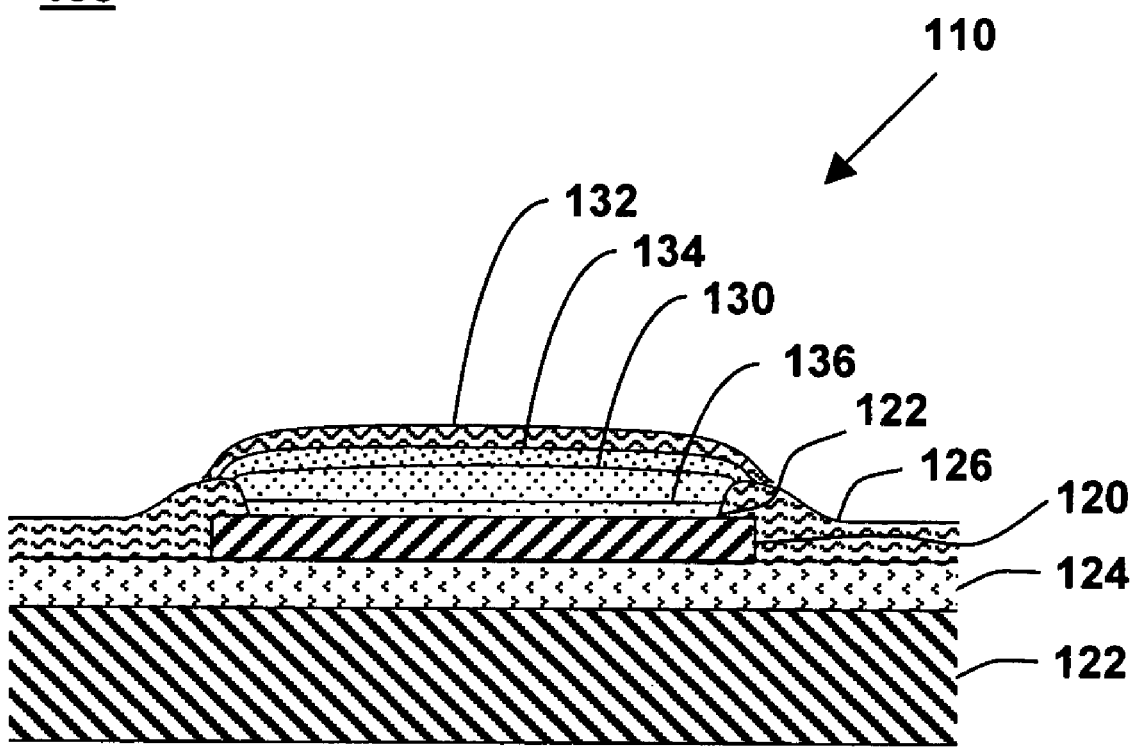
FIG. 1 illustrates a cross-sectional cutaway view of a plated bond pad on an integrated circuit, in accordance with one embodiment of the current invention.

FIG. 1 shows a cross-sectional cutaway view of a plated bond pad on an integrated circuit, in accordance with one embodiment of the present invention at 100. Multiple bond pads 120 are typically located on the surface of an integrated circuit 110. The bond pads provide for electrical connections such as external power supplies, ground lines, input signals, output signals, data lines, address lines, other integrated circuits, and external electronic components. Integrated circuit 110 includes a plurality of bond pads 120. Integrated circuit 110 with the plurality of bond pads 120 may be contained, for example, on an undiced semiconductor wafer or on an individual semiconductor die.

Bond pad 120 is electrically isolated from a semiconductor substrate 122 such as a silicon substrate by one or more insulating layers 124. Insulating layer 124 may comprise, for example, a layer of silicon dioxide or silicon nitride. A passivation layer 126 typically covers the majority of the surface of integrated circuit 110 and protects it from scratches, abrasion, humidity, moisture and other chemicals that may come in contact with integrated circuit 110. Passivation layer 126 protects underlying metal traces, polysilicon traces, transistors, capacitors and other electronic devices that may be included with integrated circuit 110. Passivation layer 126 may be formed, for example, from a layer of plasma-enhanced vapor chemical deposition (PECVD) silicon nitride, a deposited layer of silicon dioxide or a combination thereof. Passivation layer 126 is typically patterned and etched after deposition to expose bond pads 120. Bond pads 120 are exposed to allow external wirebonds such as aluminum or gold wires to be attached to the pads. Alternatively, solder bumps and solder balls may be attached to exposed bond pads 120 to form, for example, flip chips, bumped area-array devices, chip-scale packages, and connections to tape, lead frames, ceramic packages, plastic packages, and other packages. Passivation layer 126 may be patterned and etched to expose the majority of the surface of bond pad 120, covering and overlapping the edges of bond pad 120.

Bond pad 120 comprises a bond-pad metal such as aluminum or copper, or alloys thereof. Typically, all of the bond pads 120 on any particular integrated circuit 110 comprise the same metal or metal alloy. Additional metal layers such as barrier layers may be included directly underneath bond pad 120. Barrier metals include such metals as tungsten, titanium, titanium tungsten, titanium nitride, tantalum, tantalum nitride and tungsten nitride and related alloys to prevent intermetallic diffusion between the bond-pad metallurgy and the substrate or any underlying traces that may be connected to bond pad 120.

Integrated circuit 110 with bond pad 120 includes additional layers of metal plated on top of bond pad 120. The additional layers of metal may provide improved wire bondability, solderability, corrosion resistance and reliability when compared to, for example, bare copper or aluminum pads. For example, bond pad 120 may have a layer of electroless nickel 130 plated on the bond pad, and a layer of gold 132 plated over layer of electroless nickel 130.

In one embodiment, integrated circuit 110 with bond pad 120 comprises an aluminum bond pad 120 plated with a layer of electroless nickel 130 and a layer of immersion gold 132. The aluminum may contain additional materials such as copper or silicon. For example, aluminum bond pad 120 may have a thickness between 0.5 microns (micrometers) and 1.0 micron, layer of electroless nickel 130 may have a thickness between 0.5 microns and 5.0 microns, and layer of immersion gold 132 may have a thickness between 0.05 microns and 0.25 microns. Alternatively, bond pad 120 may be plated with a layer of electroless nickel 130 and a layer of electroless gold 132. Layer of gold 132 may be plated, for example, using an electroless or autocatalytic process to a thickness between 0.1 micron and 1.5 microns or larger.

In another embodiment, a layer of electroless palladium 134 is plated onto layer of electroless nickel 130, positioned between layer of electroless nickel 130 and layer of gold 132. Layer of electroless palladium 134 may be plated, for example, to a thickness between 0.2 microns and 1.0 micron.

In another embodiment, a layer of zinc 136 is positioned between aluminum bond pad 120 and layer of electroless nickel 130. Layer of zinc 136 is typically very thin, formed prior to electroplating on aluminum using, for example, premixed metal zincates, followed by dipping into a suitable acid and re-zincating in a process commonly called double zincating. The zinc layer is displaced as soon as the nickel starts plating.

Aluminum bond pad 120 with the electroless nickel—immersion gold configuration may be used, for example, as an under-bump metallurgy (UBM) for a flip chip. The electroless nickel—electroless gold may be used, for example, with gold wirebonding to a plastic package, a ceramic package or a metal leadframe. The electroless nickel—electroless palladium—immersion gold may also be used, for example, with gold wirebonding to a plastic package, a ceramic package or a metal leadframe, or as an under-bump metallurgy.

In another embodiment, integrated circuit 110 with bond pad 120 comprises a copper bond pad 120 plated with layer of electroless nickel 130 and layer of immersion gold 132. The copper may contain additional materials such as iron, zinc, or phosphorus. For example, copper bond pad 120 may have a thickness between 0.5 microns and 1.0 micron, layer of electroless nickel 130 may have a thickness between 0.5 microns and 5.0 microns, and layer of immersion gold 132 may have a thickness between 0.05 microns and 0.25 microns. Alternatively, layer of gold 132 may be plated to a thickness between, for example, 0.1 microns and 1.5 microns or larger using electroless gold. In another embodiment with the copper bond pad, a layer of electroless palladium 134 is plated onto layer of electroless nickel 130, positioned between the layer of electroless nickel 130 and layer of gold 132. Layer of electroless palladium 134 may be plated, for example, to a thickness between 0.2 microns and 1.0 micron. In another embodiment, a thin layer of palladium is positioned between copper bond pad 120 and layer of electroless nickel 130. In another example, ruthenium is used as a catalyst.

Copper bond pad 120 with the electroless nickel—immersion gold configuration may be used, for example, as an under-bump metallurgy (UBM). The electroless nickel—electroless gold may be used, for example, with gold wirebonding to a plastic package, a ceramic package or a metal leadframe. The electroless nickel—electroless palladium—immersion gold may also be used, for example, with gold wirebonding to a plastic package, a ceramic package, under-bump metallurgy, or a metal leadframe.

Figure 2:
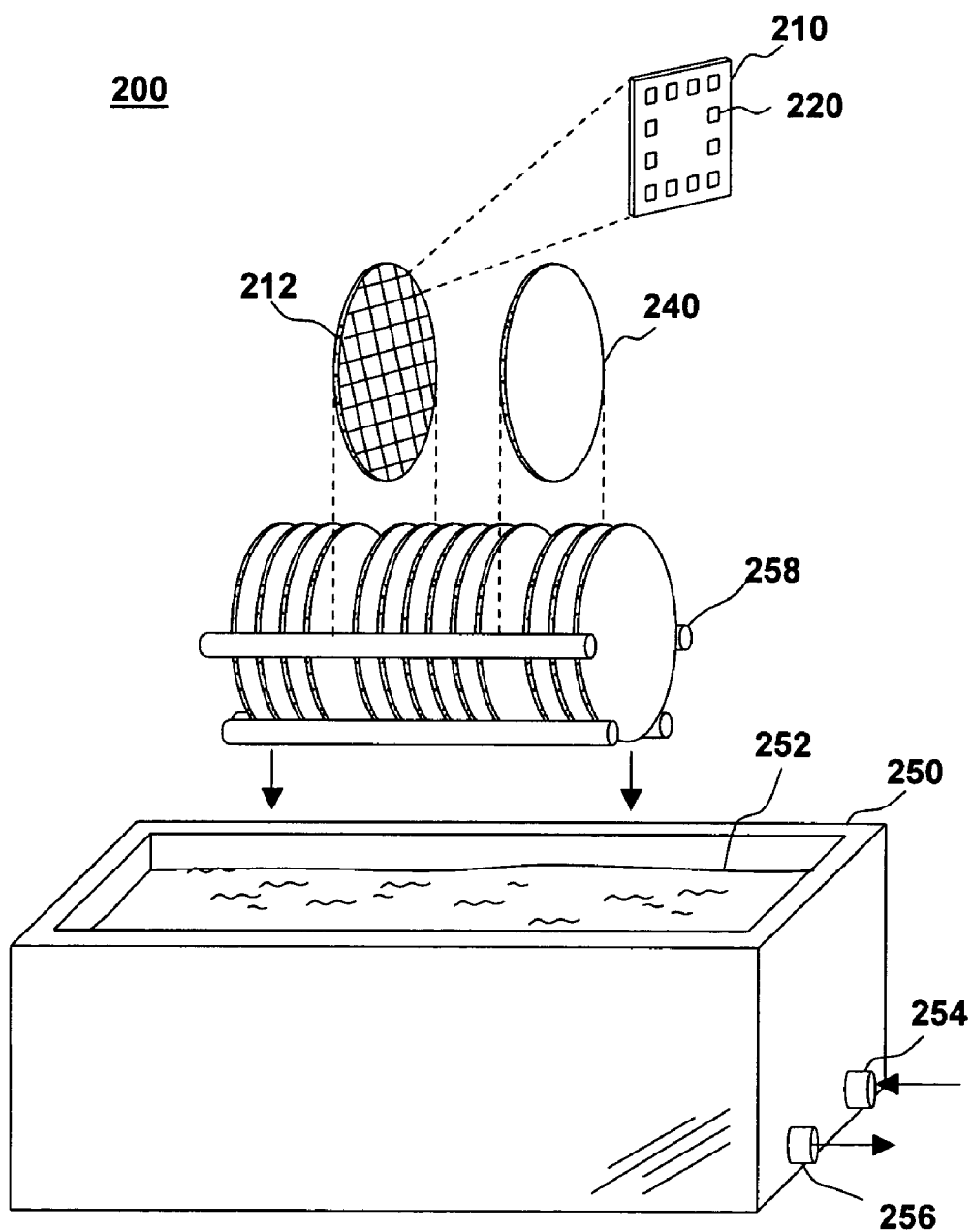
FIG. 2 illustrates a system for plating an integrated circuit, in accordance with one embodiment of the current invention.

FIG. 2 shows an illustration of a system for plating an integrated circuit, in accordance with one embodiment of the present invention at 200. Integrated circuit plating system 200 includes a plating tank 250 containing a plating solution 252 and a plating tray 258 for positioning at least one integrated circuit 210 with a plurality of bond pads 220, and one or more activation plates 240. Bond pads 220 comprise a bond-pad metal, such as copper, aluminum, or alloys thereof.

Plating tank 250 is generally formed from non-plating materials such as polypropylene, polyvinyl chloride (PVC), quartz or Teflon, and may include a cover, heaters, stirrers, timers, valves and pumps to heat and regulate plating solution 252. Plating tank 250 generally includes an inlet port 254 and an outlet port 256 for adding, rejuvenating and draining plating solution 252 or other contents of plating tank 250. Generally, multiple plating tanks 250 are used in a plating system, one for each type of plating solution, others for rinsing, and still others for cleaning. Parts to be plated are typically cleaned and rinsed, then placed in a first plating bath to plate the first metal, then rinsed in a rinsing tank and placed in a second plating bath to plate the second metal, and so forth. The tanks may be of suitable size to accommodate the items to be plated, activation plates 240, and plating tray 258.

Plating tray 258 may hold one or more plateable items and associated activation plates 240. Plating tray 258 may be formed from one or more non-plateable materials such as polypropylene, PVC, quartz or Teflon. Plating tray 258 may include, for example, a series of slots to accommodate wafers or carriers containing items to be plated along with activation plates 240. In one example, integrated circuit 210 with bond pads 220 that are ready to be plated are contained on a semiconductor wafer 212. Semiconductor wafer 212 may comprise, for example, a silicon substrate upon which multiple integrated circuits 210 are fabricated. Semiconductor wafer 212 may be, for example, 150 millimeters, 200 millimeters, 300 millimeters in diameter, or any standard size as is conventionally used in the industry. All integrated circuits 210 with bond pads 220 on each semiconductor wafer 212 may be plated simultaneously in integrated circuit plating system 200.

When integrated circuit plating system 200 is being used, a batch of semiconductor wafers 212 with integrated circuits 210 that are ready to be plated are positioned in plating tray 258. Activation plates 240 are positioned adjacent to semiconductor wafers 212, interleaved between each semiconductor wafer 212. Activation plate 240 may comprise a material such as copper, aluminum, or a suitable alloy. Activation plate 240 may be formed in the shape of a semiconductor wafer, with a similar diameter and thickness. The thickness of activation plate 240 may be, for example, between 0.5 millimeters and 3.0 millimeters. In another example, activation plate 240 comprises a foil of copper or aluminum that may be placed into plating tray 258 or coupled to a backing plate and then placed into plating tray 258. Generally, an aluminum plate or foil is used when bond pads 220 are aluminum, and a copper plate or foil is used when bond pads 220 are copper. Activation plates 240 are typically positioned and carried along with interleaved semiconductor wafers 212 through one or more plating tanks 250. Activation plates 240 are typically positioned a distance between 0.125 inches and 0.250 inches from integrated circuit 210 and bond pads 220. The distance is selected to provide uniform, repeatable plated layers on bond pads 220. Alternatively, two semiconductor wafers 212 may be positioned on each side of activation plate 240, with bond pads 220 on the surfaces of each semiconductor wafer 212 facing and adjacent to activation plate 240 to increase the ratio of semiconductor wafers 212 to activation plates 240. This configuration may be repeated to fill all or a portion of plating tray 258.

A first plating tank 250 may comprise, for example, a zincation solution for cleaning aluminum bond pads 220 and zincating or plating a thin layer of zinc on bond pads 220 and activation plate 240 prior to plating the electroless nickel. This process may be repeated to improve zinc coverage and to reduce pinholes and other yield-reducing effects. A second plating tank 250 may comprise an electroless-nickel plating solution for plating a layer of nickel on bond pads 220 and activation plate 240. A third plating tank 250 may comprise an immersion-gold plating solution or an electroless gold plating solution for plating a layer of gold over the layer of electroless nickel on bond pads 220 and the activation plate 240. Another plating tank 250 may comprise an electroless-palladium plating solution for plating a layer of electroless palladium on bond pads 220 and activation plate 240 after, for example, plating the layer of electroless nickel and prior to plating the layer of gold.

Figure 3:
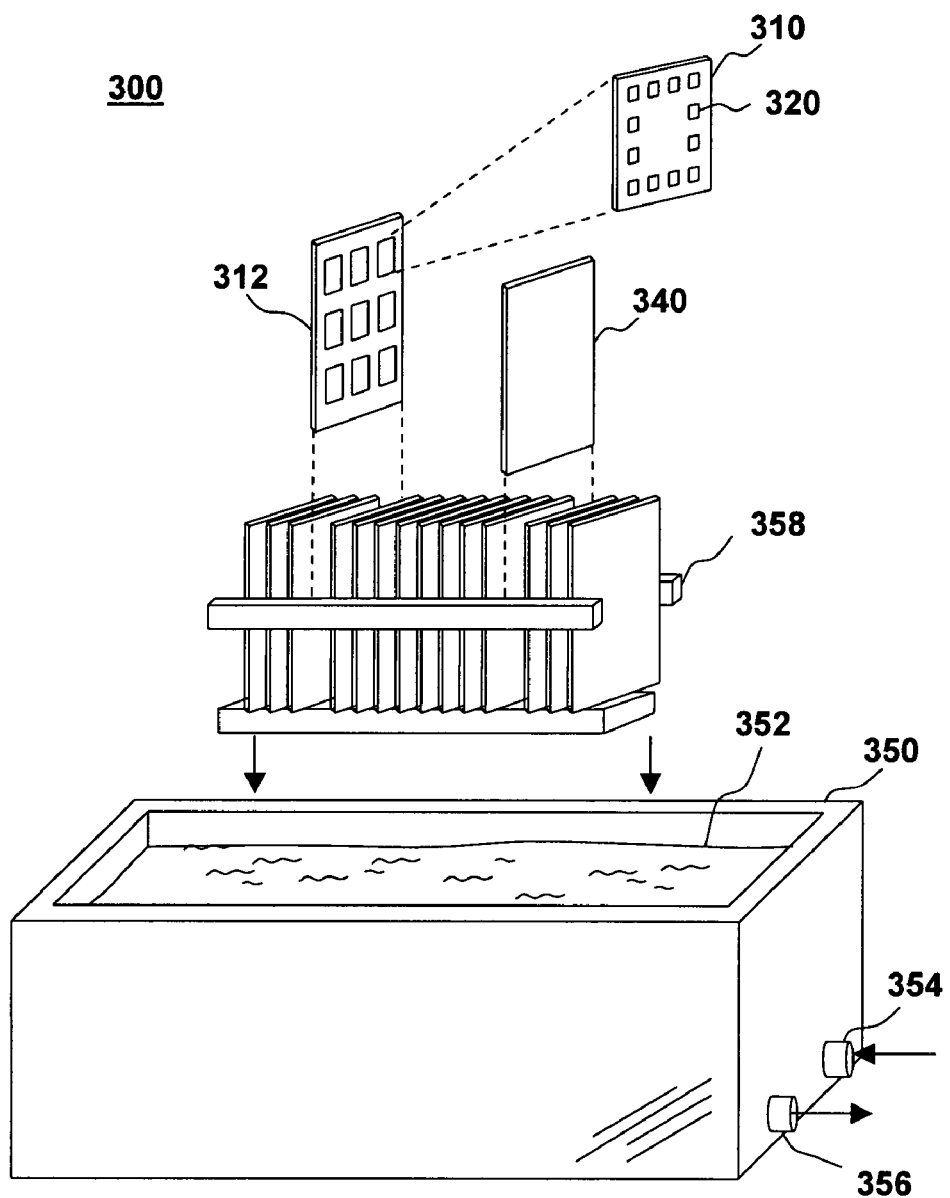
FIG. 3 illustrates a system for plating an integrated circuit, in accordance with another embodiment of the current invention.

FIG. 3 illustrates a system for plating an integrated circuit, in accordance with another embodiment of the present invention at 300. Integrated circuit plating system 300 includes a plating tank 350 containing a plating solution 352 and a plating tray 358 for positioning at least one integrated circuit 310 and one or more activation plates 340.

Plating tank 350 generally includes an inlet port 354 and an outlet port 356 for adding, rejuvenating, and draining plating solution 352 or other contents of plating tank 350. Plating tray 358 may hold one or more plateable items and associated activation plates 340. In this embodiment, integrated circuits 310 with bond pads 320 are placed on a carrier substrate 312. Carrier substrate 312 may comprise, for example, a plate of glass, ceramic, PVC, Teflon, or other suitably rigid, non-plating material. Carrier substrate 312 may accommodate, for example, individual die for plating one or more metals. The die may be of varying size and shape. In one example, an individual die has a size of 394 mils (thousandths of an inch) by 472 mils with a thickness of 22 mils, and 483 pads. In another example, a die has a size of 787 mils by 866 mils with a thickness of 22 mils, and a total of 220 bond pads. In another example, a die has a size of 86 mils by 98 mils, with 16 pads. In another example, bond pads 320 are square with an outer dimension of 100 microns by 100 microns, with a passivation layer that covers the edge of bond pads 320 and overlaps the pads by 5 micron on each side. The die may be attached to carrier substrate 312 using, for example, a suitable tape or adhesive. In another example, pre-fabricated holders may be used to attach integrated circuits 310 to carrier substrate 312.

When integrated circuit plating system 300 is being used, integrated circuits 310 with bond pads 320 are placed on carrier substrate 312 and positioned in plating tray 358. Activation plates 340 are positioned adjacent to carrier substrates 312, interleaved between each carrier substrate 312. Activation plate 340 may comprise a material such as copper, aluminum, or a suitable alloy. Activation plate 340 may be formed, for example, in the shape of carrier substrate 312 with outer dimensions equal to carrier substrate 312 and with a thickness to provide sufficient rigidity during use. In another example, activation plate 340 may comprise a foil of copper or aluminum that may be placed into plating tray 358 or coupled to a backing plate, and then placed into plating tray 358. Generally, an aluminum plate or foil is used when bond pads 320 are aluminum, and a copper plate or foil is used when bond pads 320 are copper. Activation plates 340 are typically positioned and carried along with interleaved carrier substrates 312 through one or more plating tanks 350 to clean, plate, and rinse integrated circuits 310 and activation plates 340 to plate materials such as electroless zinc, electroless nickel, electroless gold, immersion gold and electroless palladium. Activation plates 340 are typically positioned a distance between 0.125 inches and 0.250 inches from integrated circuit 310 and bond pads 320. Alternatively, two carrier substrates 312 may be positioned on each side of activation plate 340, with bond pads 320 on the surfaces of each carrier substrate 312 facing and adjacent to activation plate 340 to increase the ratio of carrier substrates 312 to activation plates 340. This configuration may be repeated to fill all or a portion of plating tray 358.

In another embodiment of the invention, plating tray 358 is the same object as activation plate 340. In such an embodiment, the activation plate holds the plateable items while being immersed in plating tank 350.

Figure 4:
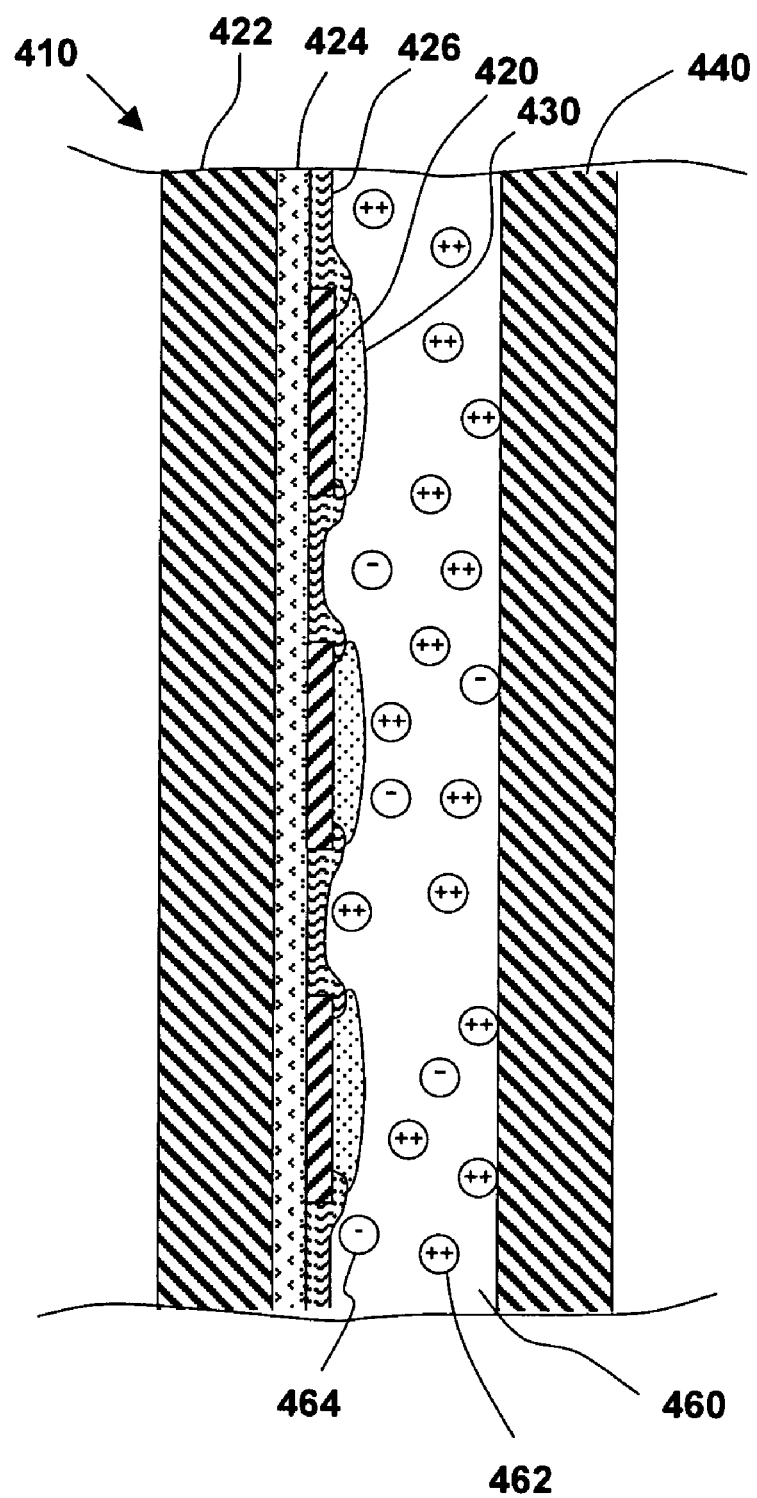
FIG. 4 illustrates a method of plating an integrated circuit, in accordance with one embodiment of the current invention.

FIG. 4 shows a method of plating an integrated circuit, in accordance with one embodiment of the present invention at 400. Integrated circuit plating method 400 includes an integrated circuit 410 with bond pads 420, an activation plate 440 placed adjacent to integrated circuit 410 with bond pads 420, and a plating solution 460. Plating solution 460 contains cations 462 and anions 464. In one example, nickel (Ni++) cations are present in plating solution 460. Numerous factors that can prevent uniform plating of integrated circuit bond pads 420 can be overwhelmed by placing a plate of the integrated circuit pad metal (e.g., aluminum) into plating solution 460 with integrated circuits 410. Integrated circuits 410 may be in wafer form or as singulated die. Die from a variety of wafers may be mounted on a carrier substrate. In some cases, activation plate 440 may increase by several orders of magnitude the area being plated, since integrated circuit bond pads 420 typically comprise a small fraction of the integrated circuit surface area. Since activation plate 440 is being plated simultaneously at the potential required for proper plating, the relatively large charge generated at the surface of the plate is transported through the solution to the integrated circuit, overcoming the small potential differences between the bond pads and effectively neutralizing galvanic and photovoltaic effects.

Integrated circuit 410 includes a plurality of bond pads 420, separated from a substrate 422 by one or more insulating layers 424 underneath bond pads 420. A passivation layer 426 typically covers the edges and overlaps a portion of the periphery of bond pads 420. Bond pads 420 on integrated circuit 410 are generally connected to transistors, capacitors, resistors, and other electronic devices fabricated in substrate 422. Connections may be made directly to the substrate, though are typically made with one or more metal or semiconductor traces routed between bond pads 420 and the electronic devices. Bond pads 420 may be connected to p-type materials or n-type materials, through p-n junctions, and other devices that may cause the open circuit potential on bond pads 420 to vary from pad to pad. Variations in the open circuit potential can alter the rate at which layers of plated metals 430 are formed on bond pads 420. A lower open circuit potential at bond pad 420 can increase the local plating rate. Light applied to the junctions and substrate 422 of integrated circuit 410 can create photovoltaic potentials that impact the plating rate and uniformity. Geometrical considerations such as proximity of bond pads to each other, the size of bond pads 420, and the quantities of bond pads 420 can also lead to plating non-uniformities. The transport of metallic cations 462 to bond pads 420 is effected by the local concentrations of metallic cations 462 and the concentration gradient. A larger concentration of metallic cations 462 and a higher concentration gradient generally results in a higher plating rate. Other transport-related phenomena such as agitation of the plating bath, bubbles in the solution, and contaminants can also affect the local plating rate. Initiation of the plating process may be hindered by native oxides on the surface of bond pads 420 and local open circuit potentials that prevent initial layers of plated metal 430 from occurring.

Inclusion of activation plate 440 adjacent to integrated circuit 410 with bond pads 420 resolves many of these issues with plating non-uniformity and inhibition of the plating operation. Insertion of activation plate 440 into plating solution 460 generates significant concentrations of metallic cations 462 to initiate and maintain constant plating rates. The high metallic ion concentration of metallic cations 462 provides a more uniform local potential within the plating bath, also leading to constant, uniform plating rates. To ensure uniformity of open circuit potentials and a large supply of metallic cations 462, activation plate 440 comprises essentially the same material as bond pads 420 such as copper for copper pads, aluminum for aluminum pads, or suitable alloys thereof.

FIG. 5 shows a flow diagram of a method for plating an integrated circuit, in accordance with the present invention at 500. Integrated-circuit plating method 500 includes steps used to plate one or more layers of metal on one or more integrated circuits.

The bond pads on the integrated circuits are cleaned and rinsed, as seen at block 510. The bond pads comprise a bond-pad metal such as copper, aluminum, or alloys thereof. The integrated circuits may be contained, for example, on a semiconductor wafer, diced into individual die and placed on a carrier substrate, or located in a suitable holder for electroless plating of metals. The cleaning cycle may include, for example, a degreasing step or a solvent step for removing organic contaminants from the surfaces of the integrated circuit and from the bond pads on the integrated circuits. The cleaning cycle may include a short etch cycle or an acid dip to remove any oxides on the bond pads. Plasma processes such as an oxygen plasma may also be used to clean the bond pads. Rinsing may be performed, for example, in a tank of deionized water. One or more activation plates may be included with the integrated circuits and their holders during cleaning and rinsing.

Prior to or after cleaning the bond pads, the backsides of the semiconductor wafers or the singulated die may be coated with a spin-on material such as a photoresist, or other suitably protective material such as a layer of acrylic enamel that may be applied readily using a technique such as spraying or brushing. The protective materials may be used to cover any unpassivated regions that should not be plated. Other materials can be used, such as an adhesive film with an acetate backing. Acrylic enamel or other types of adhesive may be used to attach singulated die onto the carrier substrate. Patterned photoresist or other patterned materials typically are not required on the front surface of the integrated circuit with the bond pads. Additionally, since electroless plating solutions are generally used with this plating method, connection of external electrodes to the bond pads, the substrate of the wafer or the integrated circuit is not required. Plated materials are selectively plated onto the exposed metal of the bond pads.

The activation plate is positioned adjacent to the integrated circuits, as seen at block 520. The activation plate is selected to have substantially the same metal as the bond-pad metal. For example, the activation plate comprises copper or an alloy thereof when the bond-pad metal comprises copper or a copper alloy. In another example, the activation plate comprises aluminum or an alloy thereof when the bond-pad metal comprises aluminum or an aluminum alloy such as Al—Si or Al—Cu. The activation plates are typically positioned a distance between 0.125 inches and 0.250 inches from the integrated circuits. When the integrated circuits are located on one or more semiconductor wafers, the activation plates are interleaved between the semiconductor wafers or otherwise oriented so that multiple wafers can be plated simultaneously in the same bath. When the integrated circuits are located on one or more carrier substrates, the activation plates are interleaved between the carrier substrates or otherwise oriented so that multiple carrier substrates can be plated at the same time. The semiconductor wafers or the carrier substrates may be positioned, for example, so that two wafers or substrates face the two sides of each activation plate, thereby increasing the number of integrated circuits and decreasing the number of activation plates required.

In a preparatory step for electroless nickel plating, aluminum bond pads on the integrated circuits may be zincated and rinsed, as seen at block 530. Zincation of aluminum bond pads provides a thin layer of zinc on the surface of the aluminum bond pads, resulting in an improved surface for additional plated metals such as the electroless nickel. The zincation step may use one of the pre-mixed zincation solutions available commercially. Zincation solutions typically contain zinc oxide and sodium hydroxide. The zincation step may be repeated with a short intervening etch step in a process referred to as double zincation. The activation plates may be zincated at the same time as the integrated circuits.

A layer of electroless nickel is plated on the bond pads and the activation plate, as seen at block 540. The integrated circuits and the activation plates positioned adjacent to the integrated circuits are immersed into a bath of electroless nickel solution to plate a layer of electroless nickel on the bond pads and on the activation plate. The electroless nickel solution is available commercially, and may be heated to a bath temperature of, for example, between 80 degrees centigrade and 90 degrees centigrade. The integrated circuits are retained in the electroless nickel bath until the desired thickness of electroless nickel is obtained. A plating time may be, for example, about 15 minutes. The electroless nickel may be plated, for example, to a thickness between 0.5 microns and 5.0 microns. When plating is completed, the integrated circuits and the activation plates may be rinsed and prepared for the next plating bath.

A layer of electroless palladium may be plated on the bond pads and the activation plate, as seen at block 550. The electroless palladium may be plated after plating the layer of electroless nickel and prior to plating a layer of gold. The layer of electroless palladium may be plated to a thickness between, for example, 0.2 microns and 1.0 micron. The layer of electroless palladium may be plated on the nickel-plated bond pads in preparation for the plating of immersion gold. For example, the electroless palladium may be plated for about twenty minutes with a bath temperature of about 60 degrees centigrade. When plating is completed, the integrated circuits and the activation plates may be rinsed and prepared for the next plating bath.

A layer of gold is plated over the layer of electroless nickel on the bond pads and the activation plate, as seen at block 560. The layer of gold may be plated, for example, using an immersion gold or an electroless gold. The immersion gold typically requires an underlying layer of palladium to allow for the substitution of gold molecules for the palladium in this self-limiting process. The immersion gold may be plated to a thickness, for example, between 0.05 microns and 0.25 microns where it tends to self-limit. For example, the immersion gold may be plated for a time of five minutes or more at a bath temperature of nominally 72 degrees centigrade. The immersion gold may be stirred and recirculated to provide adequate agitation during plating. The electroless gold requires an electroless gold plating solution available commercially. The electroless gold may be plated to a thickness, for example, between 0.1 microns and 1.5 microns. When plating is completed, the integrated circuits and the activation plates may be rinsed and dried. The integrated circuits may be removed from the carrier substrate, or integrated circuits on a semiconductor wafer may be diced and prepared for additional packaging steps. The packaging steps may include, for example, electroplating the bond pads with lead-tin solder, bumping or attaching solder balls for flip chips and ball-grid arrays, or placing the integrated circuits in packages and wire-bonding to the bond pads. The activation plates may be stripped and recycled, or discarded.

While the embodiments of the invention focus predominantly on plating bond pads for integrated circuits, use of an activation plate can be applied to other plated structures such as single-layer and multiple-layer printed circuit boards with copper traces, flex circuits, flexible tapes with copper traces, connectors, lead frames, ceramic packages and other electrical and electronic devices. Furthermore, the activation plate may be applied generally to any electroless plated or immersion plated metal.

While the embodiments of the invention disclosed herein are presently preferred, various changes and modifications can be made without departing from the spirit and scope of the invention. The scope of the invention is indicated in the appended claims, and all changes that come within the meaning and range of equivalents are intended to be embraced therein.

What is claimed is:

1. A method of plating an integrated circuit, comprising:
   positioning an activation plate adjacent to at least one integrated circuit, the integrated circuit including a plurality of bond pads comprising a bond-pad metal, and the activation plate comprising the bond-pad metal;
   plating a layer of electroless nickel on the bond pads and the activation plate; and
   plating a layer of gold over the layer of electroless nickel on the bond pads and the activation plate.

2. The method of claim 1 wherein the bond-pad metal comprises copper.

3. The method of claim 1 wherein the bond-pad metal comprises aluminum.

4. The method of claim 1 wherein the activation plate is positioned a distance between 0.125 inches and 0.250 inches from the at least one integrated circuit.

5. The method of claim 1 wherein the layer of electroless nickel is plated to a thickness between 0.5 inicrons and 5.0 microns.

6. The method of claim 1 wherein the layer of gold is plated to a thickness between 0.05 microns and 1.5 microns.

7. The method of claim 1 wherein the layer of gold is plated using one of an immersion gold or an electroless gold.

8. The method of claim 1 wherein the at least one integrated circuit is contained on a semiconductor wafer.

9. The method of claim 1 wherein the at least one integrated circuit is mounted on a carrier substrate when the layer of electroless nickel is plated.

10. The method of claim 1 further comprising:
    plating a layer of electroless palladium on the plurality of bond pads and the activation plate after plating the layer of electroless nickel and prior to plating the layer of gold.

11. The method of claim 10 wherein the layer of electroless palladium is plated to a thickness between 0.2 microns and 1.0 micron.

12. The method of claim 1 further comprising:
    zincating the plurality of bond pads and the activation plate prior to plating the layer of electroless nickel, the bond-pad metal comprising aluminum.

13. A system for plating an integrated circuit, comprising:
    means for positioning an activation plate adjacent to at least one integrated circuit, the integrated circuit including a plurality of bond pads comprising a bond-pad metal, and the activation plate comprising the bond-pad metal;
    means for plating a layer of electroless nickel on the bond pads and the activation plate; and
    means for plating a layer of gold over the layer of electroless nickel on the bond pads and the activation plate.

14. The system of claim 13 wherein the activation plate is positioned a distance between 0.125 inches and 0.250 inches from the at least one integrated circuit.

15. The system of claim 13 further comprising:
    means for plating a layer of electroless palladium on the bond pads and the activation plate after plating the layer of electroless nickel and prior to plating the layer of gold.

16. The system of claim 13 further comprising:
    means for zincating the plurality of bond pads and the activation plate prior to plating the layer of electroless nickel, the bond-pad metal comprising aluminum.

* * * * *